(12) United States Patent
Butler et al.

(10) Patent No.: US 10,120,293 B2
(45) Date of Patent: Nov. 6, 2018

(54) OBJECT POSITIONING IN LITHOGRAPHY

(71) Applicant: ASML Netherlands B.V., Veldhoven (NL)

(72) Inventors: Hans Butler, Veldhoven (NL); Ramidin Izair Kamidi, Veldhoven (NL); Yanin Kasemsinsup, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/028,676

(22) PCT Filed: Sep. 25, 2014

(86) PCT No.: PCT/EP2014/070472
§ 371 (c)(1),
(2) Date: Apr. 11, 2016

(87) PCT Pub. No.: WO2015/062791
PCT Pub. Date: May 7, 2015

(65) Prior Publication Data
US 2016/0252827 A1 Sep. 1, 2016

Related U.S. Application Data

(60) Provisional application No. 61/897,693, filed on Oct. 30, 2013.

(51) Int. Cl.
*G03B 27/58* (2006.01)
*G03F 7/20* (2006.01)
(Continued)

(52) U.S. Cl.
CPC ........... *G03F 7/70775* (2013.01); *G01B 9/02* (2013.01); *G01B 11/002* (2013.01); *G03F 7/70725* (2013.01)

(58) Field of Classification Search
CPC ..... G01B 11/002; G01B 9/02; G03F 7/70725; G03F 7/70775; G03F 7/707; G03F 7/70758
See application file for complete search history.

(56) References Cited

U.S. PATENT DOCUMENTS 4,492,195 A * 1/1985 Takahashi ............. F02D 31/003
 123/339.11
4,860,707 A * 8/1989 Ohata ................... F02D 31/005
 123/339.2

(Continued)

FOREIGN PATENT DOCUMENTS

CN 101566854 10/2009
CN 101763124 6/2010
(Continued)

OTHER PUBLICATIONS

Chinese Office Action dated Jan. 3, 2017 in corresponding Chinese Patent Application No. 201480058785.6.
(Continued)

*Primary Examiner* — Deoram Persaud
(74) *Attorney, Agent, or Firm* — Pillsbury Winthrop Shaw Pittman LLP (57) ABSTRACT

An object positioning system includes an object; a measurement system to measure the position of the object, wherein each sensor of the measurement system has an associated measurement area on the object and wherein a location of at least one measurement area on the object is dependent on the position of the object; an actuator system to position the object; a control system configured to drive the actuator system, wherein the control system includes an observer with a dynamic model of the object to estimate an internal dynamic behavior of the object, wherein the dynamic model includes the dependency of the location of at least one measurement area on the position of the object, and wherein (Continued)

the control system is configured to drive the actuator system in dependency of an output of the observer.

20 Claims, 5 Drawing Sheets

(51) Int. Cl.
  *G01B 9/02* (2006.01)
  *G01B 11/00* (2006.01)

(56) References Cited

U.S. PATENT DOCUMENTS

| | | | | |
|---|---|---|---|---|
| 5,726,879 | A * | 3/1998 | Sato | G03F 7/70725 318/561 |
| 7,098,990 | B2 * | 8/2006 | Butler | G03F 7/70725 355/53 |
| 7,327,437 | B2 | 2/2008 | Cox et al. | |
| 7,379,156 | B2 | 5/2008 | Kunst et al. | |
| 7,453,228 | B2 * | 11/2008 | Heertjes | G05B 19/19 318/135 |
| 7,468,782 | B2 * | 12/2008 | Butler | G03F 7/70725 355/72 |
| 7,742,149 | B2 * | 6/2010 | De Vos | G03F 7/70725 355/53 |
| 7,782,446 | B2 | 8/2010 | Kamidi et al. | |
| 8,279,401 | B2 | 10/2012 | Vervoordeldonk et al. | |
| 8,619,232 | B2 | 12/2013 | Butler et al. | |
| 8,675,179 | B2 * | 3/2014 | Heertjes | G03F 7/70725 355/72 |
| 8,676,355 | B2 * | 3/2014 | Takagi | G03F 7/70725 700/105 |
| 8,825,182 | B2 * | 9/2014 | Simons | G03F 7/70341 700/114 |
| 8,885,147 | B2 * | 11/2014 | Vervoordeldonk | G03F 7/70758 355/72 |
| 9,261,799 | B2 | 2/2016 | Butler | |
| 9,927,721 | B2 * | 3/2018 | Butler | G03F 7/70725 |
| 9,977,341 | B2 * | 5/2018 | Cox | G03F 7/70633 |
| 2004/0176861 | A1 * | 9/2004 | Butler | G03F 7/70725 700/63 |
| 2006/0119829 | A1 | 6/2006 | Cox et al. | |
| 2006/0139590 | A1 | 6/2006 | Kunst et al. | |
| 2006/0139613 | A1 * | 6/2006 | Houkes | G03F 7/70341 355/72 |
| 2006/0241873 | A1 * | 10/2006 | Hsin | G03F 7/70725 702/41 |
| 2007/0182944 | A1 * | 8/2007 | Van De Biggelaar | G03B 27/42 355/53 |
| 2008/0018877 | A1 * | 1/2008 | Butler | G03F 7/70725 355/72 |
| 2008/0200998 | A1 * | 8/2008 | Baggen | G05B 5/01 700/45 |
| 2008/0212054 | A1 | 9/2008 | Kamidi et al. | |
| 2009/0201477 | A1 | 8/2009 | Butler | |
| 2009/0268185 | A1 | 10/2009 | Vervoordeldonk et al. | |
| 2010/0123890 | A1 * | 5/2010 | Heertjes | G03F 7/70758 355/72 |
| 2010/0157264 | A1 | 6/2010 | Butler et al. | |
| 2011/0001951 | A1 | 1/2011 | Butler | |
| 2017/0199468 | A1 * | 7/2017 | Butler | G03F 7/70725 |

FOREIGN PATENT DOCUMENTS

| | | |
|---|---|---|
| CN | 101960387 | 1/2011 |
| EP | 2 053 461 | 4/2009 |
| JP | 2006-165564 | 6/2006 |
| JP | 2006-191084 | 7/2006 |
| JP | 2010-118656 | 5/2010 |
| KR | 10-2008-0080459 | 9/2008 |
| KR | 10-2010-0074056 | 7/2010 |

OTHER PUBLICATIONS

Taiwan Office Action dated May 25, 2016 in corresponding Taiwan Patent Application No. 103135088.
International Search Report and Written Opinion dated Jan. 5, 2015 in corresponding International Patent Application No. PCT/EP2014/070472.
Karl John Åström et al., "Feedback Systems—An Introduction for Scientists and Engineers," Princeton, New Jersey, ISBN: 978-0-691-13576-2, Chapter Seven, Sections 7.1-7.14, pp. 201-228 (Sep. 28, 2012).
Taiwan Office Action dated Sep. 9, 2016 in corresponding Taiwan Patent Application No. 103135088.
Korean Office Action dated Oct. 25, 2017 in corresponding Korean Patent Application No. 10-2016-7014284.

* cited by examiner

OBJECT POSITIONING IN LITHOGRAPHY

CROSS-REFERENCE TO RELATED APPLICATIONS

This application is the U.S. national phase entry of PCT patent application no. PCT/EP2014/070472, which was filed on Sep. 25, 2014, which claims the benefit of priority of U.S. provisional application No. 61/897,693, which was filed on Oct. 30, 2013, and which is incorporated herein in its entirety by reference.

FIELD

The present invention relates to an object positioning system, a lithographic apparatus including such an object positioning system, an object positioning method and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A lithographic apparatus usually comprises one or more objects that need to be accurately positioned such as a support constructed to support the patterning device and/or a substrate table constructed to hold a substrate. The lithographic apparatus therefore generally comprises an object positioning system for positioning the object, wherein the object positioning system comprises: a measurement system with one or more sensors for measuring the position of the object in one or more degrees of freedom relative to a reference; an actuator system with one or more actuators for positioning the object; and a control system configured to drive the actuator system in dependency of an output of the measurement system and a set point representing a desired position of the object.

With the increasing demand for higher throughput, the accelerations applied to the object also increase. This will result in excitation of internal dynamical modes of the object, such as a torsion mode and an umbrella mode. When the internal dynamical modes are relatively low-frequency and are observable by the measurement system, they may limit the obtainable bandwidth of the closed-loop object positioning system and thus limit the performance, i.e. speed and accuracy, of the object positioning system.

Another drawback is that depending on the type of measurement system, the internal dynamics may be observed differently by the measurement system for different positions of the object. Control design is therefore based on worst-case scenarios in order to be robust for all positions of the object which limits the obtainable bandwidth even further.

SUMMARY

It is desirable to provide an object positioning system, in particular for a lithographic apparatus, with improved performance, i.e. with a higher bandwidth.

According to an embodiment of the invention, there is provided an object positioning system comprising: an object to be positioned; a measurement system with one or more sensors for measuring the position of the object in one or more degrees of freedom relative to a reference; an actuator system with one or more actuators for positioning the object; a control system or controller configured to drive the actuator system in dependency of an output of the measurement system and a set point representing a desired position of the object, wherein each sensor of the measurement system has an associated measurement area on the object of which the position in one or more degrees of freedom relative to the reference is measured, wherein a location of at least one measurement area on the object is dependent on the position of the object in at least one degree of freedom, wherein the control system comprises an observer with a dynamical model of the object to estimate an internal dynamic behavior of the object based on an input to the object and the output of the measurement system, wherein the dynamic model includes the dependency of the location of at least one measurement area on the position of the object in at least one degree of freedom, and wherein the control system is further configured to drive the actuator in dependency of an output of the observer as well.

According to another embodiment, there is provided a lithographic apparatus comprising an object positioning system according to an embodiment of the invention.

According to a further embodiment, there is provided a method for positioning an object, comprising:

a. providing a measurement system with one or more sensors for measuring the position of the object in one or more degrees of freedom relative to a reference, wherein each sensor of the measurement system has an associated measurement area on the object of which the position is measured in one or more degrees of freedom relative to the reference, and wherein a location of at least one measurement are on the object is dependent on the position of the object in at least one degree of freedom;

b. providing an actuator system with one or more actuators for positioning the object;

c. providing a set point representing a desired position of the object;

d. providing a dynamic model of the object to estimate an internal dynamic behavior of the object, wherein the dynamic model includes the dependency of the location of at least one measurement area on the position of the object in at least one degree of freedom;

e. estimating the internal dynamic behavior of the object using the dynamic model by providing an input to the object and by the measurement system measured position of the object to the dynamic model; and f. positioning the object with the actuator system based on the set point and the by the measurement system measured position of the object while taking into account the internal dynamic behavior.

According to yet another embodiment of the invention, there is provided a device manufacturing method wherein use is made of an object positioning system according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
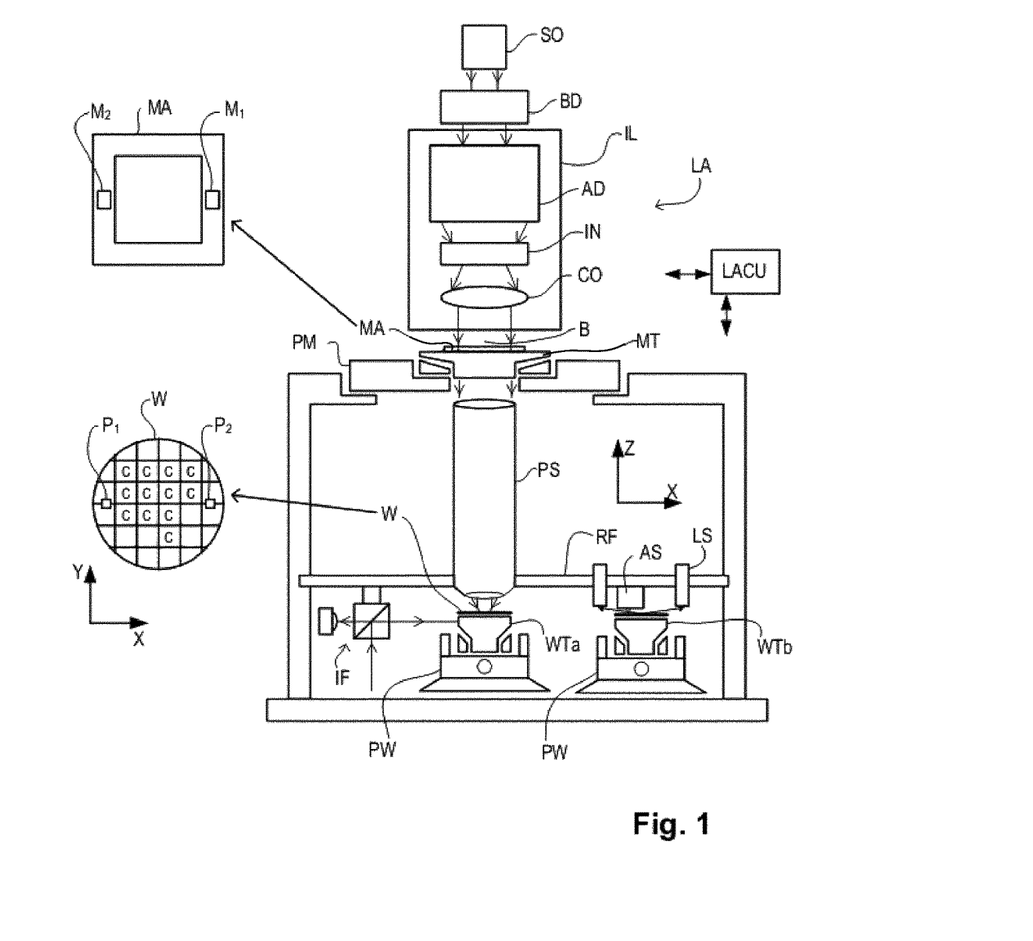
FIG. 1 depicts a lithographic apparatus according to an embodiment of the invention.

FIG. 1 schematically depicts a lithographic apparatus LA according to one embodiment of the invention. The apparatus comprises: an illumination system (illuminator) IL configured to condition a radiation beam B (e.g. UV radiation or EUV radiation); a support structure or patterning device support (e.g. a mask table) MT constructed to support a patterning device (e.g. a mask) MA and connected to a first positioner PM configured to accurately position the patterning device in accordance with certain parameters; a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables) or one substrate table and one calibration stage. In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the support structure (e.g. mask table) MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Alternatively the lithographic apparatus may have a substrate table WTa and a calibration table, wherein the substrate table WTa is configured to hold a wafer and wherein the calibration table is configured to hold active sensor parts of the substrate table.

The apparatus further includes a lithographic apparatus control unit or controller LACU which controls all the movements and measurements of the various actuators and sensors described. LACU also includes signal processing and data processing capacity (e.g. it includes one or more physical processor) to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit or central processor, communicating with these sub-systems processing units, with operators and with other apparatuses involved in the lithographic manufacturing process.

As described above, the support structure (e.g. mask table) MT and the substrate table WTa/WTb are examples of objects within the lithographic apparatus that may need to be positioned (accurately) relative to a reference, e.g. the projection system PS. Other examples of objects that may be positionable are optical elements in projection lenses and the calibration table.

In order to position objects relative to a reference within the lithographic apparatus, the lithographic apparatus comprises one or more object positioning systems according to the invention, which will be described in more detail below. Although in the remainder of this description the general term "object" will be used, it will be appreciated that this term can be replaced by substrate table, mask table, table, optical element, projection lens, etc., where applicable.

Figure 2:
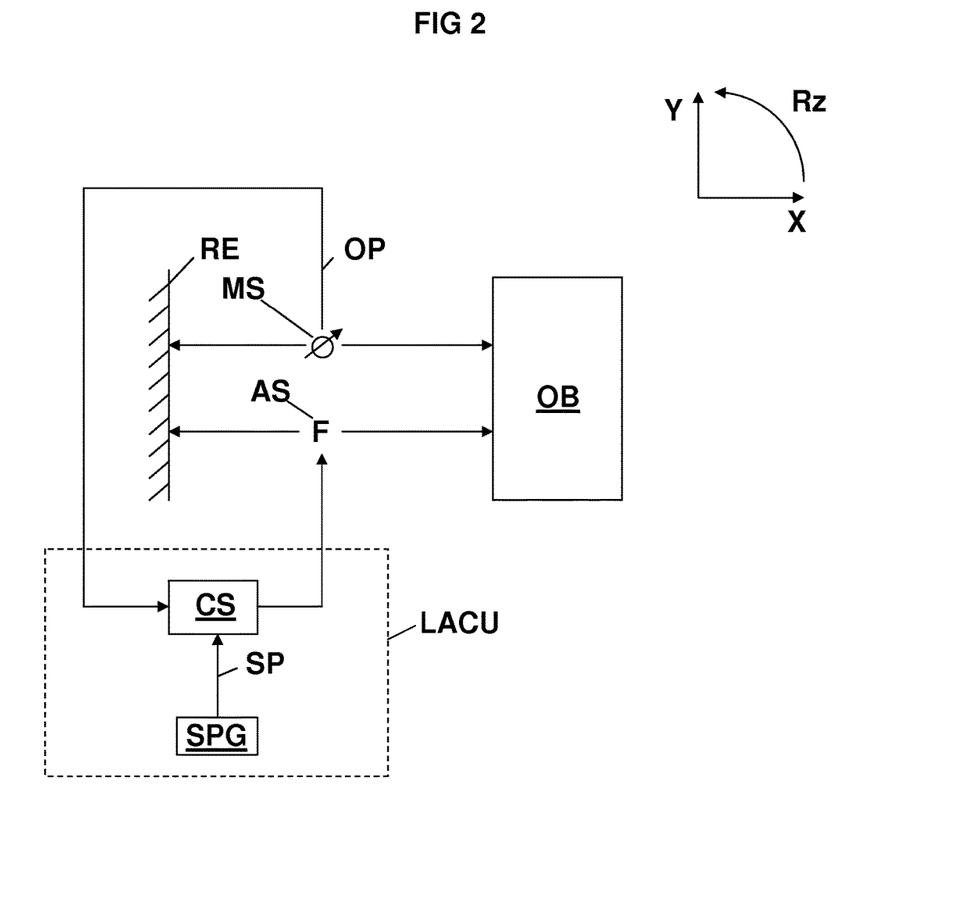
FIG. 2 depicts schematically an object positioning system according to an embodiment of the invention.

An object positioning system according to an embodiment of the invention is schematically depicted in FIG. 2 and comprises: an object OB, e.g. a substrate table or mask table as shown in FIG. 1, to be positioned relative to a reference RE, e.g. a projection system; a measurement system MS with one or more sensors, e.g. position sensors IF of FIG. 1, for measuring the position of the object in one or more degrees of freedom, e.g. translational directions X, Y or rotational direction Rz, relative to the reference RE; an actuator system AS with one or more actuators for positioning the object OB, for example by applying forces F to the object OB; and a control system CS configured to drive the actuator system AS in dependency of an output OP of the measurement system MS and a set point SP representing a desired position of the object OB.

In FIG. 2 the actuator system AS is shown as applying a force F between the object OB and the reference RE, however, it is not necessary per se that the force is applied to the reference RE. In order to minimize disturbances as a result of the applied forces a so-called separate force frame may be provided which is uncoupled from the reference RE allowing to apply forces F to the object without disturbing the reference RE which is used by the measurement system MS to determine the position of the object relative to the reference RE.

In FIG. 2 the measurement system MS is shown as measuring the position of the object OB relative to the reference RE. Although this figure may suggest that a direct measurement is performed, it is also possible that the measurement system is configured to measure the position of the object relative to another structure. The measurement system MS is considered to measure the position of the object in one or more degrees of freedom relative to the reference RE as long as this position can be deducted from the output OP of the measurement system MS. Examples of degrees of freedom which can be measured by the measurement system MS are a X-direction, a Y-direction perpendicular to the X-direction, and a rotational direction Rz about an axis perpendicular to both the X- and Y-direction, commonly referred to as the Z-direction.

The set point SP may be provided to the control system CS by a set point generator SPG. Both the set point generator and the control system CS may be part of a lithographic apparatus control unit LACU as also depicted in FIG. 1.

Figure 3:
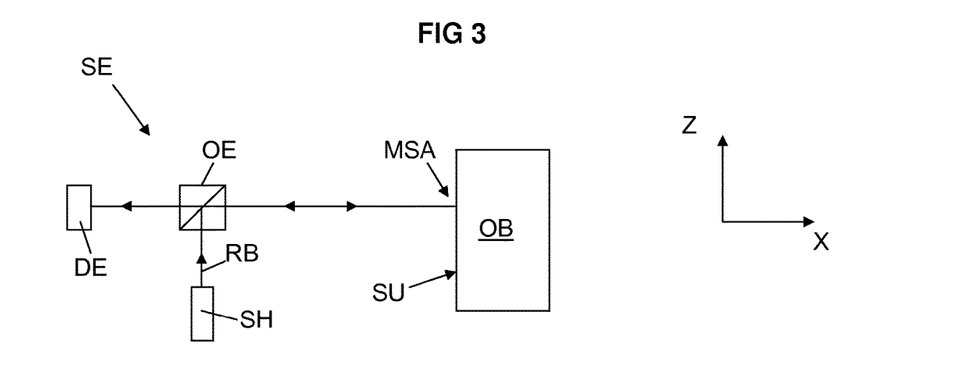
FIG. 3 depicts in more detail a measurement system that can be applied in an object positioning system according to an embodiment of the invention.

FIG. 3 depicts schematically a sensor SE that may be part of the measurement system MS of FIG. 2. The sensor comprises a sensor head SH with a radiation source for emitting a radiation beam RB towards an object OB.

The radiation beam RB is at least partially directed by an optical element OE, e.g. a beam splitter, towards the object OB, is reflected of a surface SU back towards the optical element OE to interfere with a reference beam, e.g. a part of the initial radiation beam RB, which interference is detected by a detector DE to determine the position of the object OB in an X-direction. The area where the radiation beam reflects of the object forms a measurement area MSA on the object of which the position actually is measured to determine the position of the object OB.

When the object OB is only moved in the X-direction, an output of the detector DE will vary corresponding to the movement in X-direction, but the location of the measurement area MSA on the object relative to the object OB remains constant. However, when the object OB is only moved in the Z-direction, the output of the detector DE will not change, but the location of the measurement area MSA on the object will change along with the movement in Z-direction. Hence, the location of the measurement area MSA on the object OB is dependent on the position of the object in at least one degree of freedom, namely in this case the Z-direction.

Figure 4:
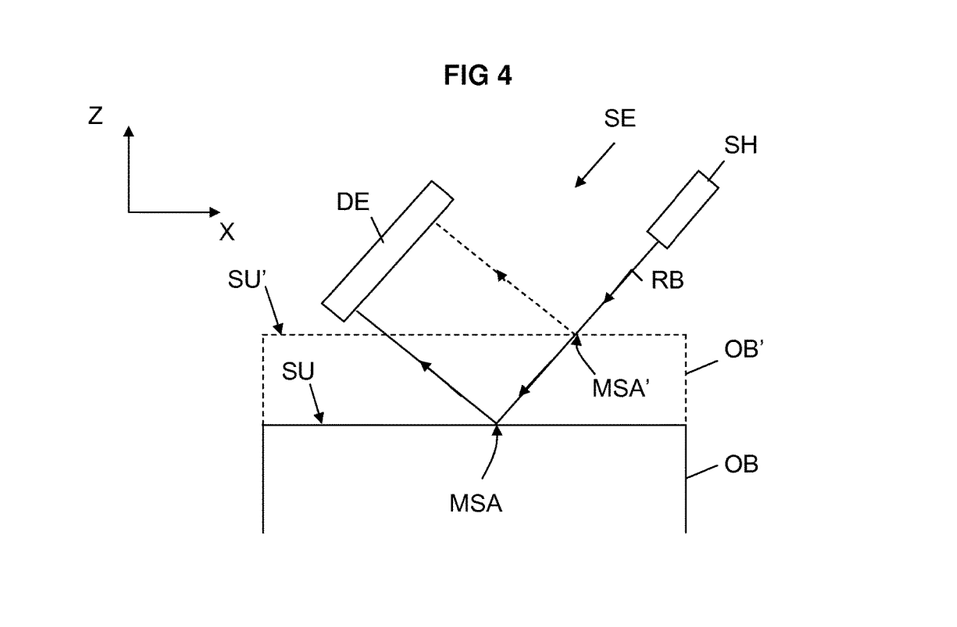
FIG. 4 depicts in more detail another measurement system that can be applied in an object positioning system according to an embodiment of the invention.

FIG. 4 depicts a sensor SE that may be part of the measurement system MS of FIG. 2. The sensor comprises a sensor head SH with a radiation source for emitting a radiation beam RB towards an object OB. The object OB is also shown in another position as indicated by the dashed lines OB' in which the object OB is displaced in Z-direction relative to the object OB in solid lines.

The radiation beam RB is reflected of a surface SU, indicated by reference symbol SU' for position OB', towards a detector DE which processes the incoming reflected radiation beam to derive a position of the object OB. The surface SU may for instance comprise a grating (not shown) allowing to determine the position of the object in X-direction and/or Z-direction depending on the type and configuration of the sensor head SH and detector DE.

For the object OB shown in solid lines, the radiation beam RB is reflected of a measurement area MSA on the object OB. When the object OB is only moved in the X-direction, an output of the detector DE may vary corresponding to the movement in X-direction, but also the location of the measurement area MSA on the object OB will change along with the movement in X-direction.

When the object OB is only moved in Z-direction towards the position OB' shown in dashed lines, the location of the measurement area has changed accordingly to location MSA'.

Hence, in FIG. 4, the location of the measurement area on the object is dependent on the position of the object in at least two degrees of freedom, namely in this case the X-direction and the Z-direction.

Figure 5:
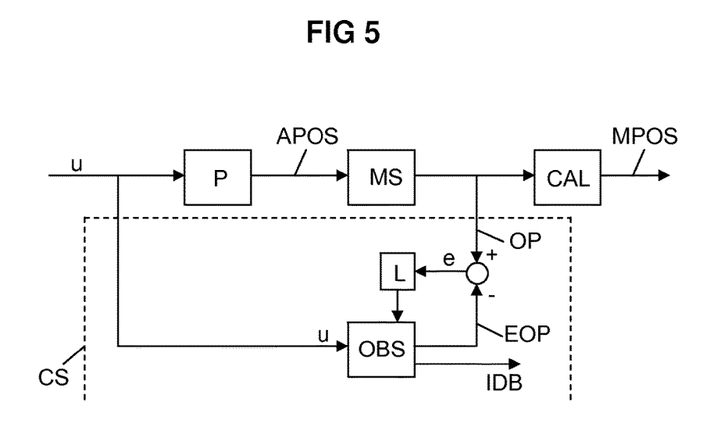
FIG. 5 depicts a control scheme for an object positioning system according to an embodiment of the invention.

FIG. 5 depicts schematically a part of a block diagram that is representative for an object positioning system according to an embodiment of the invention. The block diagram comprises a block P that is representative for the actual behavior of an object to be positioned. Input to the block P is a signal u which may be a force applied by actuators of an actuation system. The signal u may be based on a set point representative for a desired position and a measured position MPOS and calculated by a control system CS which is not shown in its entirety. Signal u may also be referred to as an input to the object.

The input u results in an actual position APOS of the object. The actual position APOS is considered to be the output of block P. The actual position APOS is measured by a measurement system MS. The measurement system MS provides an output OP, e.g. in the form of interferometer beam lengths which does not necessarily correspond to the degrees of freedom of interest, so that the output OP may have to be converted by a calculation unit CAL into a measured position MPOS in the desired degrees of freedom.

The control system CS comprises an observer OBS with a dynamic model of the object to estimate an internal dynamic behavior of the object based on the set point (which is in this embodiment indirectly provided to the observer OBS via signal u) and the output OP of the measurement system MS, which output OP is provided to the observer OBS via signal e and gain L which will be explained in more detail below.

The observer OBS in this embodiment also includes a model of the measurement system and outputs an estimated output EOP which corresponds to the output OP of the measurement system MS. Due to differences between the actual dynamic behavior of the object and the dynamic model and/or external disturbances applied to the object, the estimated output EOP may differ from the actual output OP. The signal e is the difference between the output OP and the estimated output EOP. The error signal is fed back to the observer via gain L to compensate for the differences to bring the estimated output EOP in line with the output OP.

In the object positioning system according to an embodiment of the invention, the measurement system comprises one or more sensors for measuring the position of the object in one or more degrees of freedom relative to a reference, wherein each sensor of the measurement system has an associated measurement area on the object of which the position in one or more degrees of freedom relative to the reference is measured, and wherein a location of at least one measurement area on the object is dependent on the position of the object in at least one degree of freedom as for instance depicted in FIGS. 3 and 4.

The dynamic model includes the dependency of the location of at least one measurement area on the position of the object in at least one degree of freedom.

Figure 6:
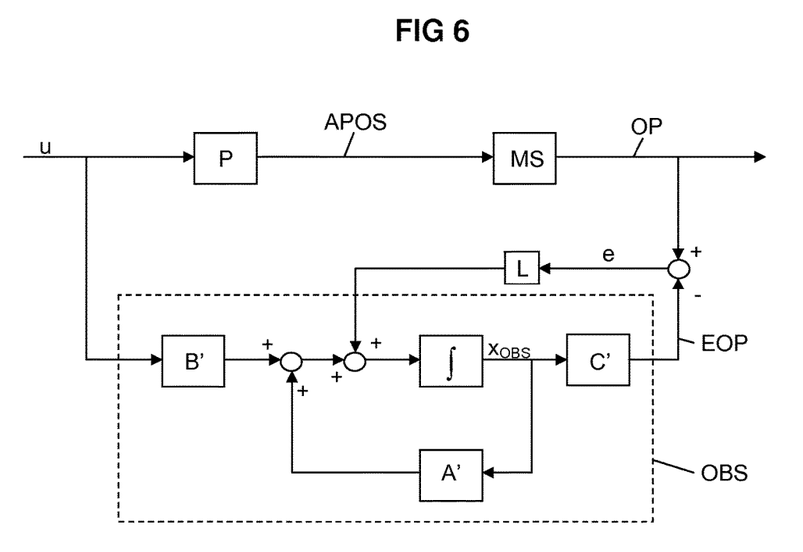
FIG. 6 depicts in more detail an observer that can be applied in an object positioning system according to an embodiment of the invention.

FIG. 6 depicts a possible state space representation of the observer OBS depicted in a schematic block diagram. The states of the observer are indicated by reference symbol $x_{OBS}$. The dynamic model of the plant P and measurement system MS is represented by the matrices A', B' and C'.

The equations governing the observer thus yield:

$$\frac{d}{dx}x_{OBS} = A' \cdot x_{OBS} + B' \cdot u + L(OP - EOP) \quad \Rightarrow \text{state equation}$$

$$EOP = C' \cdot x_{OBS} \quad \Rightarrow \text{output equation}$$

The term L(OP-EPO) is a correction term, which helps to reduce the effects due to differences between the dynamic model and the actual system P, MS, e.g. in the presence of discrepancies between A' and B' of the dynamic model and the A and B matrix of the actual system, respectively. The matrix L serves as a weighting matrix.

In a possible embodiment of the invention, dependency of the location of at least one measurement area on the position of the object in at least one degree of freedom may be included into the dynamic model by providing at least one coefficient of the output equation, in this case at least one coefficient of the C' matrix, that is dependent on the position of the object in the at least one degree of freedom. This may be indicated by C'(p), wherein p is the position of the object in the at least one degree of freedom. Position p may be the measured position MPOS of the object or may be the set point SP (see FIG. 1). The set point SP as being the position p on which the output equation is dependent has the benefit that a more stable system is obtained.

In an embodiment, the weighting matrix L is also dependent on the position of the object in the at least one degree of freedom. Hence, the equations may be written as:

$$\frac{d}{dx}x_{OBS} = A' \cdot x_{OBS} + B' \cdot u + L(p) \cdot (OP - EOP) \quad \Rightarrow \text{state equation}$$

$$EOP = C'(p) \cdot x_{OBS} \quad \Rightarrow \text{output equation}$$

When e=OP−EOP, the following error equation can be formulated:

$$\frac{d}{dt}e = (A' - L(p) \cdot C'(p)) \cdot e$$

A benefit of making both the output equation as well as the weighting matrix dependent on the position of the object is that given A' and C'(p) an L(p) can be chosen such that the eigenvalues of (A'−L(p)*C'(p)) are constant, which means that the error behavior is independent of the position of the object.

Referring to FIG. 5 again, the improved observer can be used to estimate the internal dynamic behavior IDB, e.g. in the form of internal dynamic modes. According to an embodiment of the invention, the internal dynamic behavior as output of the observer is used to drive the actuator system. Two examples of using the internal dynamic behavior will be described with reference to the FIGS. 7 and 8 below.

Figure 7:
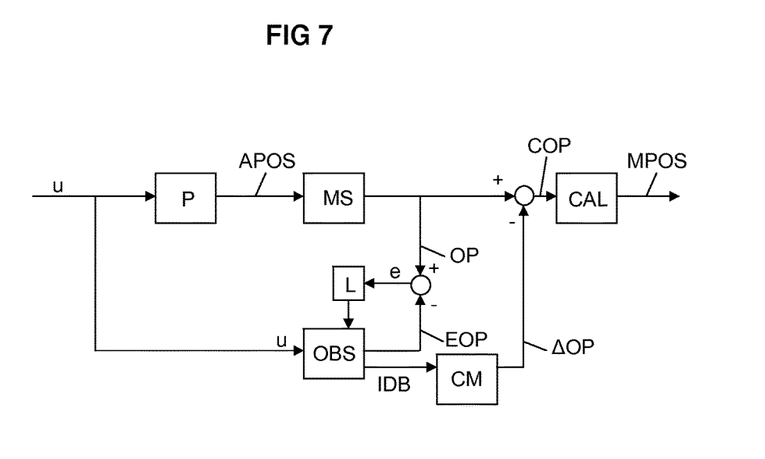
FIG. 7 depicts a control scheme with measurement compensation for an object positioning system according to another embodiment of the invention.

FIG. 7 depicts a schematic block diagram with a measurement system MS in accordance with FIG. 5 having an output OP and an observer OBS having an output IDB representative for the internal dynamic behavior of a corresponding object. The internal dynamic behavior is determined as described above. The internal dynamic behavior, e.g. in the form of internal dynamic modes, have a contribution in the output OP, which means that the internal dynamic behavior has an effect on each sensor output of the measurement system. A conversion matrix CM is depicted converting the internal dynamic behavior IDB into the contribution AOP in the output OP. The contribution AOP comprises the contribution per sensor and can be subtracted from the output OP to obtain a compensated output COP in which the internal dynamic behavior is less present. Hence, the effect of the internal dynamic behavior on the measured position of the object is minimized. As a result, the control system driving the actuation system sees less of the internal dynamic behavior, so that the bandwidth can be increased.

Figure 8:
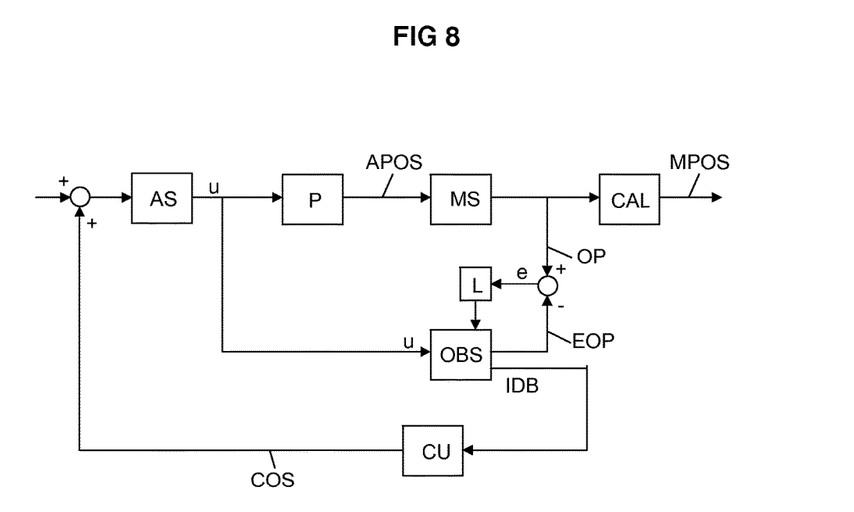
FIG. 8 depicts a control scheme with active damping for an object positioning system according to a further embodiment of the invention.

FIG. 8 depicts a schematic block diagram similar to FIG. 5, but with the addition of an active damping feedback for the internal dynamic behavior. The internal dynamic behavior IDB output of the observer is provided to a control unit CU which provides a control signal COS to the actuator system AS in order to dampen the internal dynamic behavior. When the internal dynamic behavior is actively dampened, the control system driving the actuation system to position the object sees less of the internal dynamic behavior, so that the bandwidth can be increased. As an alternative or in combination passive damping can be used to damp the internal dynamic behaviour.

Another benefit of an embodiment of the invention is that feedforward, if present, can be improved. In an embodiment, the feedforward applied to the system is the inverse of the system. When the internal dynamic behavior is less present, i.e. the control system sees less of the internal dynamic behavior, the feedforward can be designed independent of the position of the object.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An object positioning system comprising:
  an object to be positioned;
  a measurement system with one or more sensors configured to measure the position of the object in one or more degrees of freedom relative to a reference, wherein each of the one or more sensors of the measurement system has an associated measurement area on the object of which the position in one or more degrees of freedom relative to the reference is measured and wherein a location of at least one measurement area on the object is dependent on the position of the object in at least one degree of freedom;
  an actuator system with one or more actuators configured to position the object;
  a control system configured to drive the actuator system in dependency of an output of the measurement system and a set point representing a desired position of the object,
  wherein the control system comprises an observer with a dynamic model of the object to estimate an internal dynamic behavior of the object based on an input to the object and the output of the measurement system,
  wherein the dynamic model includes a dependency of the location of at least one measurement area on the position of the object in at least one degree of freedom, and
  wherein the control system is configured to drive the actuator system in dependency of an output of the observer, and
  wherein the control system is configured to compensate the output of the measurement system for the internal dynamic behavior using the estimated internal dynamic behavior.

2. The system according to claim 1, wherein when the dynamic model of the object is described as a differential equation having a state equation estimating the internal dynamic behavior and an output equation estimating the output of the measurement system based on the estimated internal dynamic behavior, at least one coefficient of the output equation of the differential equation depends on the location of the at least one measurement area that is dependent on the position of the object in the at least one degree of freedom.

3. The system according to claim 1, wherein the observer comprises a feedback loop configured to generate a correction term for the estimated internal dynamic behavior that can be described as a weighting matrix times a difference between the output of the measurement system and a by the observer estimated output of the measurement system, and wherein the weighting matrix comprises at least one coefficient depending on the location of the at least one measurement area that is dependent on the position of the object in the at least one degree of freedom.

4. The system according to claim 3, wherein the weighting matrix is selected such that a dynamic behavior of the difference between the output of the measurement system and the estimated output of the measurement system as defined by the observer is less dependent on the location of the at least one measurement area that is dependent on the position of the object in the at least one degree of freedom.

5. The system according to claim 1, wherein the location of the at least one measurement area that is dependent on the position of the object in the at least one degree of freedom is determined from the set point.

6. The system according to claim 1, wherein the control system is configured to dampen the internal dynamical behavior using the estimated internal dynamic behavior.

7. The system according to claim 1, wherein the measurement system comprises more sensors than degrees of freedom that the object is positionable in.

8. The system according to claim 1, wherein the one or more sensors of the measurement system are interferometers having a radiation source arranged to be stationary relative to the reference, wherein radiation from the radiation source is directed towards the measurement area on the object.

9. The system according to claim 1, wherein the one or more sensors of the measurement system are encoder type sensors having a sensor head and a grating, and wherein the sensor head is arranged to be stationary relative to the reference and the grating is arranged on the object.

10. The system according to claim 9, wherein the grating of the measurement system comprises a grating arranged on the top surface of the object and a grating arranged on the bottom surface of the object.

11. A lithographic apparatus comprising an object positioning system according to claim 1.

12. A lithographic apparatus according to claim 11, further comprising:
an illumination system configured to condition a radiation beam;
a support constructed to support a patterning device, the patterning device being capable of imparting the radiation with a pattern in its cross-section to form a patterned radiation beam;
a substrate table constructed to hold a substrate; and
a projection system configured to project the patterned radiation beam onto a target portion,
wherein the object is the support or the substrate table.

13. A device manufacturing method wherein use is made of an object positioning system according to claim 1.

14. A method for positioning an object, the method comprising:
providing a measurement system with one or more sensors configured to measure a position of the object in one or more degrees of freedom relative to a reference, wherein each of the one or more sensors of the measurement system has an associated measurement area on the object of which the position in one or more degrees of freedom relative to the reference is measured, and wherein a location of at least one measurement area on the object is dependent on the position of the object in at least one degree of freedom;
providing an actuator system with one or more actuators configured to position the object;
providing a set point representing a desired position of the object;
providing a dynamic model of the object to estimate an internal dynamic behavior of the object, wherein the dynamic model includes a dependency of the location of at least one measurement area on the position of the object in at least one degree of freedom;
estimating the internal dynamic behavior of the object using the dynamic model by providing to the dynamic model, an input to the object and the by the measurement system measured position of the object;
compensating the output of the measurement system for the internal dynamic behavior using the estimated internal dynamic behavior; and
positioning the object with the actuator system based on the set point and the by the measurement system measured position of the object while taking the internal dynamical behavior into account.

15. The method according to claim 14, wherein when the dynamic model of the object is described as a differential equation having a state equation estimating the internal dynamic behavior and an output equation estimating the output of the measurement system based on the estimated internal dynamic behavior, at least one coefficient of the output equation of the differential equation depends on the location of the at least one measurement area that is dependent on the position of the object in the at least one degree of freedom.

16. The method according to claim 14, comprising performing a feedback loop to generate a correction term for the estimated internal dynamic behavior that can be described as a weighting matrix times a difference between the output of the measurement system and an estimated output of the measurement system, and wherein the weighting matrix comprises at least one coefficient depending on the location of the at least one measurement area that is dependent on the position of the object in the at least one degree of freedom.

17. The method according to claim 14, comprising dampening the internal dynamical behavior using the estimated internal dynamic behavior.

18. The method according to claim 14, wherein the measurement system comprises more sensors than degrees of freedom that the object is positionable in.

19. A non-transitory computer-readable medium comprising instructions, when executed, configured to cause a computer system to at least:
obtain a measured position of an object using a measurement system, the measurement system having one or more sensors configured to measure the position of the object in one or more degrees of freedom relative to a reference, wherein each of the one or more sensors of the measurement system has an associated measurement area on the object of which the position in one or more degrees of freedom relative to the reference is measured, and wherein a location of at least one measurement area on the object is dependent on the position of the object in at least one degree of freedom;
estimate an internal dynamic behavior of the object using a dynamic model of the object by providing to the dynamic model, an input to the object and the by the measurement system measured position of the object, the dynamic model configured to estimate the internal dynamic behavior of the object and the dynamic model including a dependency of the location of at least one measurement area on the position of the object in at least one degree of freedom;
cause compensation of the output of the measurement system for the internal dynamic behavior using the estimated internal dynamic behavior; and
output information to enable positioning of the object with an actuator system based on a set point representing a desired position of the object and the by the measurement system measured position of the object while taking the internal dynamical behavior into account.

20. The computer-readable medium of claim 19, wherein the dynamic model of the object is described as a differential equation having a state equation estimating the internal dynamic behavior and an output equation estimating the output of the measurement system based on the estimated internal dynamic behavior, and at least one coefficient of the output equation of the differential equation depends on the location of the at least one measurement area that is dependent on the position of the object in the at least one degree of freedom.

* * * * *